(12) United States Patent
Ramdani

(10) Patent No.: US 8,802,516 B2
(45) Date of Patent: Aug. 12, 2014

(54) NORMALLY-OFF GALLIUM NITRIDE-BASED SEMICONDUCTOR DEVICES

(75) Inventor: Jamal Ramdani, Scarborough, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 745 days.

(21) Appl. No.: 12/657,757

(22) Filed: Jan. 27, 2010

(65) Prior Publication Data

US 2011/0180854 A1 Jul. 28, 2011

(51) Int. Cl.
*H01L 21/336* (2006.01)
*H01L 21/338* (2006.01)
*H01L 31/0336* (2006.01)

(52) U.S. Cl.
USPC .......................................... 438/172; 438/285

(58) Field of Classification Search
None
See application file for complete search history.

(56) References Cited

U.S. PATENT DOCUMENTS

| 7,382,001 | B2 | 6/2008 | Beach | |
|---|---|---|---|---|
| 2004/0155260 | A1* | 8/2004 | Kuzmik | 257/192 |
| 2005/0023555 | A1 | 2/2005 | Yoshida et al. | |
| 2005/0110043 | A1* | 5/2005 | Otsuka et al. | 257/194 |
| 2007/0298556 | A1 | 12/2007 | Beach | |
| 2008/0006845 | A1 | 1/2008 | Derluyn et al. | |
| 2008/0185608 | A1* | 8/2008 | Chitnis | 257/99 |
| 2008/0210949 | A1* | 9/2008 | Makabe et al. | 257/76 |
| 2008/0248634 | A1 | 10/2008 | Beach | |
| 2009/0140293 | A1 | 6/2009 | Vertiatchikh et al. | |

FOREIGN PATENT DOCUMENTS

| JP | 2000-277724 | 10/2000 |
|---|---|---|
| JP | 2006-228891 | 8/2006 |

OTHER PUBLICATIONS

Yong Cai, et al., "High-Performance Enhancement-Mode AlGaN/GaN HEMTs Using Fluoride-Based Plasma Treatment", IEEE Electron Device Letters, vol. 26, No. 7, Jul. 2005, p. 435-437.
Shuo Jia, et al., "Enhancement-Mode AlGaN/GaN HEMTs on Silicon Substrate", IEEE Transactions on Electron Devices, vol. 53, No. 6, Jun. 2006, p. 1474-1477.
S. Vitanov, et al., "Normally-Off AlGaN/GaN HEMTs with InGaN Cap Layer: A Theoretical Study", ISDRS 2007, Dec. 12-14, 2007, College Park, MD, 2 pages.
Wataru Saito, et al., "Recessed-Gate Structure Approach Toward Normally Off High-Voltage AlGaN/GaN HEMT for Power Electronics Applications", IEEE Transactions on Electron Devices, vol. 53, No. 2, Feb. 2006, p. 356-362.

(Continued)

*Primary Examiner* — Zandra Smith
*Assistant Examiner* — Pamela E Perkins
(74) *Attorney, Agent, or Firm* — Jacqueline J. Garner; Frederick J. Telecky, Jr.

(57) ABSTRACT

A method includes forming a relaxed layer in a semiconductor device. The method also includes forming a tensile layer over the relaxed layer, where the tensile layer has tensile stress. The method further includes forming a compressive layer over the relaxed layer, where the compressive layer has compressive stress. The compressive layer has a piezoelectric polarization that is approximately equal to or greater than a spontaneous polarization in the relaxed, tensile, and compressive layers. The piezoelectric polarization in the compressive layer could be in an opposite direction than the spontaneous polarization in the compressive layer. The relaxed layer could include gallium nitride, the tensile layer could include aluminum gallium nitride, and the compressive layer could include aluminum indium gallium nitride.

13 Claims, 4 Drawing Sheets

(56) References Cited

OTHER PUBLICATIONS

X. Hu, et al., "Enhancement mode AlGaN/GaN HFET with selectively grown pn junction gate", Electronics Letters, vol. 36, No. 8, Apr. 13, 2000, p. 753-754.

V. Kumar, et al., "High transconductance enhancement-mode AlGaN/GaN HEMTs on SiC substrate", Electronics Letter, vol. 39, No. 24, Nov. 27, 2003, 2 pages.

Y. Irokawa, et al., "MgO/p-GaN enhancement mode metal-oxide semiconductor field-effect transistors", Applied Physics Letters, vol. 84, No. 15, Apr. 12, 2004, p. 2919-2921.

Notification of Transmittal of the International Search Report and the Written Opinion of the International Searching Authority, or the Declaration dated Sep. 20, 2011 in connection with International Patent Application No. PCT/US11/022678.

* cited by examiner

NORMALLY-OFF GALLIUM NITRIDE-BASED SEMICONDUCTOR DEVICES

TECHNICAL FIELD

This disclosure relates generally to semiconductor devices. More specifically, this disclosure relates to normally-off gallium nitride-based semiconductor devices.

BACKGROUND

Various III-V compounds are being investigated for use in high-power electronics applications. These compounds include III-V nitrides such as gallium nitride (GaN), aluminum gallium nitride (AlGaN), and aluminum indium gallium nitride (AlInGaN). These compounds can be used to form High Electron Mobility Transistors (HEMTs) for use in high-power high-voltage applications.

Many conventional GaN-based transistor devices operate in a normally-on state or in a depletion mode. This typically requires the use of a negative bias voltage in order to turn off the transistor devices. The use of negative bias voltages is often undesirable. While some normally-off GaN-based transistor devices have been proposed, those devices also suffer from various disadvantages.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
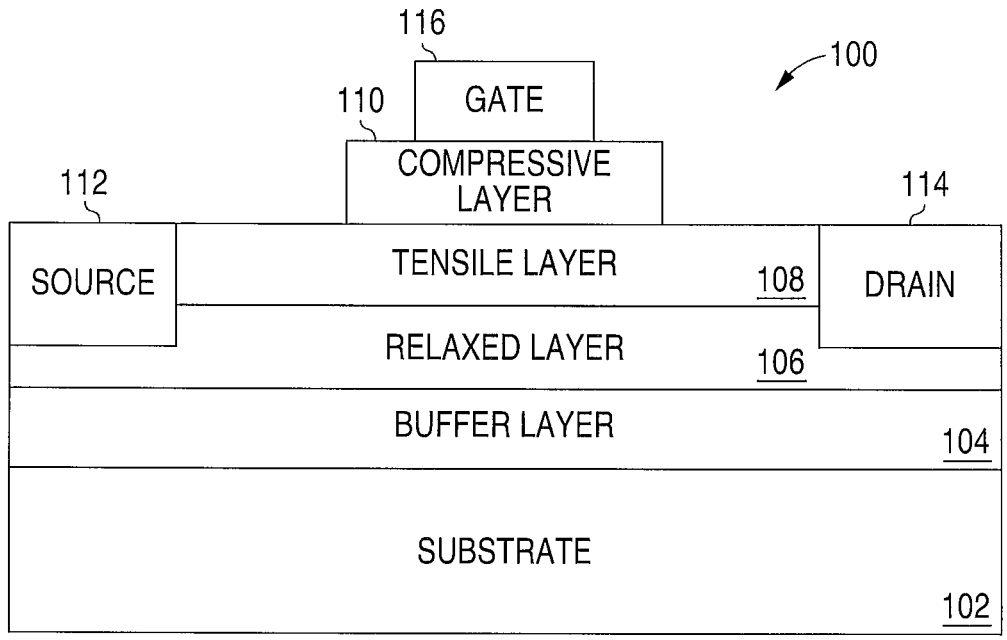
FIG. 1 illustrates a first example normally-off gallium nitride-based semiconductor device according to this disclosure.

FIG. 1 illustrates a first example normally-off gallium nitride-based semiconductor device 100 according to this disclosure. As shown in FIG. 1, the semiconductor device 100 is formed over a substrate 102. The substrate 102 represents any suitable semiconductor substrate that supports or carries other structures of the semiconductor device 100. The substrate 102 could, for example, represent a silicon, sapphire, or silicon carbide substrate.

A buffer layer 104 is formed over the substrate 102. The buffer layer 104 typically represents a thin layer used to help isolate other structures in the semiconductor device 100 from the substrate 102 (such as from defects in the substrate 102). The buffer layer 104 could be formed from any suitable material(s) and in any suitable manner. For example, the buffer layer 104 could represent an epitaxial layer, such as a gallium nitride (GaN) or aluminum gallium nitride (AlGaN) epitaxial layer.

A relaxed layer 106 is formed over the buffer layer 104. The relaxed layer 106 represents an active layer formed from material(s) generally not under tensile or compressive stress or under only a small amount of tensile or compressive stress. The relaxed layer 106 could be formed from any suitable material(s) and in any suitable manner. For example, the relaxed layer 106 could represent a GaN epitaxial layer.

A tensile layer 108 is formed over the relaxed layer 106. The tensile layer 108 represents a barrier layer formed from material(s) under tensile stress. The tensile layer 108 could be formed from any suitable material(s) and in any suitable manner. For example, the tensile layer 108 could represent an AlGaN epitaxial layer. Note that the aluminum concentration (if any) in the buffer layer 104 could be much less than the aluminum concentration in the tensile layer 108.

A compressive layer 110 is formed over the tensile layer 108. The compressive layer 110 represents a barrier layer formed from material(s) under compressive stress. The compressive layer 110 could be formed from any suitable material(s) and in any suitable manner. For example, the compressive layer 110 could be formed by depositing an epitaxial layer of AlInGaN and etching the AlInGaN to leave a portion of the AlInGaN over the tensile layer 110. The compressive layer 110 could also be formed by depositing AlInGaN in a specified area defined by a mask. Note that the aluminum concentration (if any) in the buffer layer 104 could be much less than the aluminum concentration in the compressive layer 110.

A source region 112 and a drain region 114 are formed in the tensile layer 108 and possibly in the relaxed layer 106. The source region 112 and the drain region 114 could be formed in any suitable manner, such as by masking the structure and performing a doping process (like an implantation or diffusion process). Also, any suitable dopant(s) could be used to form each of the source and drain regions 112-114.

A gate 116 is formed over the compressive layer 110. The gate 116 could be formed from any suitable conductive material(s) and in any suitable manner. For example, the gate 116 could be formed by depositing conductive material(s) over the structure and etching the conductive material(s) to form the gate 116. The gate 116 could also be formed by depositing conductive material(s) in a specified area defined by a mask.

As noted above, many conventional GaN-based transistor devices operate in a normally-on state or in a depletion mode. This is caused by spontaneous polarization, which results from asymmetry in the atomic structure of a GaN wurtzite crystal structure and from partial ionic bonding between aluminum, indium, or gallium and nitrogen. This spontaneous polarization induces a charge separation along the crystal growth axis for gallium face structures. Also, when a wide bandgap barrier layer 108 (such as AlGaN with an aluminum mole fraction between 10-30%) is used, a tensile strain is created due to lattice mismatch and thermal coefficient mismatch. This strain induces a piezoelectric polarization that further enhances charge separation in the AlGaN/GaN system. Bandgap discontinuities between low bandgap (GaN) and wide bandgap (AlGaN) layers and charge separation result in the formation of a two-dimensional electron gas at the AlGaN/GaN interface. The presence of this two-dimensional electron gas leads to a normally-on or depletion mode transistor.

Figure 2:
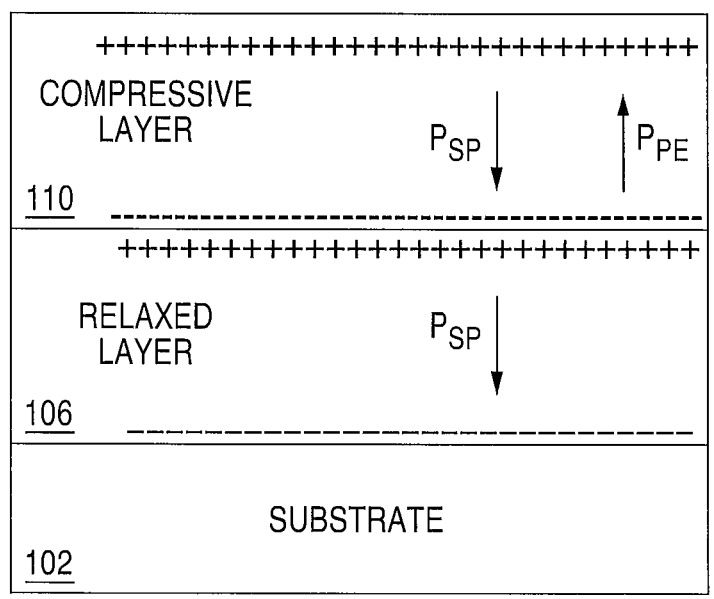
FIG. 2 illustrates example polarizations in the semiconductor device of FIG. 1 according to this disclosure.

In accordance with this disclosure, strain engineering is used in the semiconductor device 100 to compensate for the spontaneous polarization. The strain engineering is also used to invert the charge generated at the relaxed layer/tensile layer interface. An illustration of this is shown in FIG. 2, which illustrates example polarizations in the semiconductor device 100 of FIG. 1. As shown in FIG. 2, spontaneous polarization $P_{SP}$ in the layers 106 and 110 are in the same direction, but piezoelectric polarization $P_{PE}$ in the layer 110 is in the opposite direction. This can generate a depleted electron region under the gate 116. At the same time, the source and drain regions 112-114 may have electrons accumulate at their interfaces with the layers 106-108. When a positive voltage is applied to the gate 116, the positive charge at the depleted electron region is depleted, and electron accumulation at the relaxed layer/tensile layer interface leads to an on state. As a result, high current and very low specific-on resistance (RD-$S_{ON}$) can be achieved in a normally-off GaN-based transistor device.

In the semiconductor device 100, the compressive layer 110 is used to compensate for the spontaneous polarization. When the compressive layer 110 is formed from AlInGaN, the aluminum composition could be about 20%, and the indium composition could be about 20%. With this composition, a compressive strain is generated on top of the tensile layer 108, which can result in a total strain that is slightly compressive. In particular embodiments, the AlInGaN compressive layer 110 could generate as much as 0.04 C/m² of polarization, which can be slightly higher and opposite to the total spontaneous polarization in the device 100.

Figure 3:
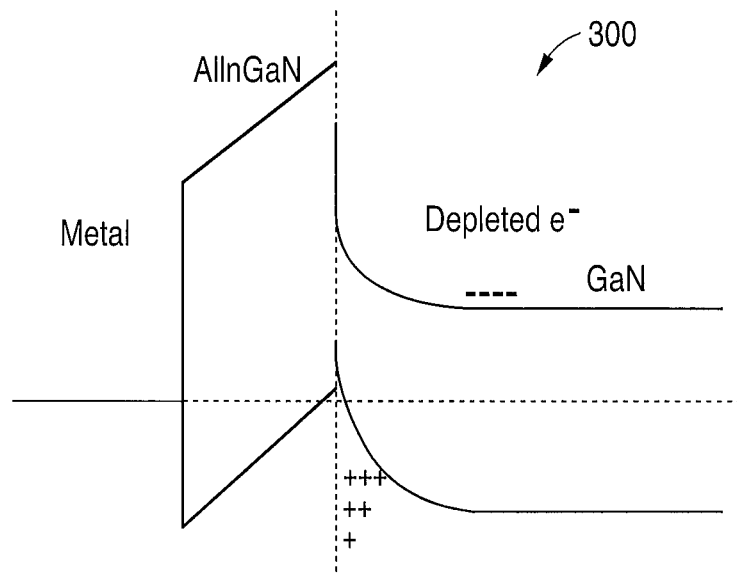
FIG. 3 illustrates an example band diagram associated with the semiconductor device of FIG. 1 according to this disclosure.

FIG. 3 illustrates an example band diagram 300 associated with the semiconductor device 100 of FIG. 1. The threshold voltage $V_T$ of the device 100 can be adjusted using the strain in the compressive layer 110 to compensate for the spontaneous polarization. With a piezoelectric polarization that is greater than or equal to the spontaneous polarization, at a zero gate voltage bias there may be little or no two-dimensional electron gas formed at the relaxed layer/tensile layer interface or at the relaxed layer/buffer layer interface.

Figure 4A:
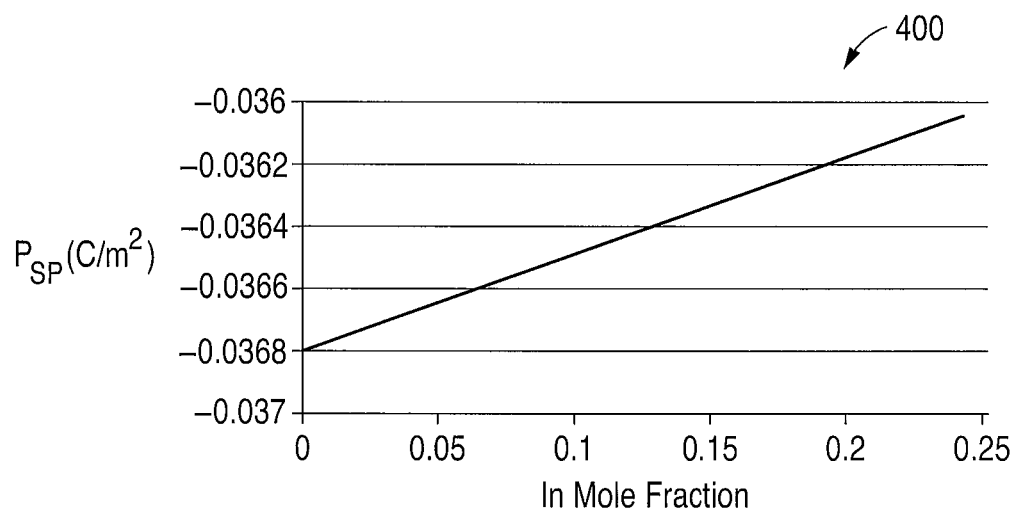
FIGS. 4A and 4B illustrate example relationships between electrical characteristics and composition of the semiconductor device of FIG. 1 according to this disclosure.
Figure 4B:
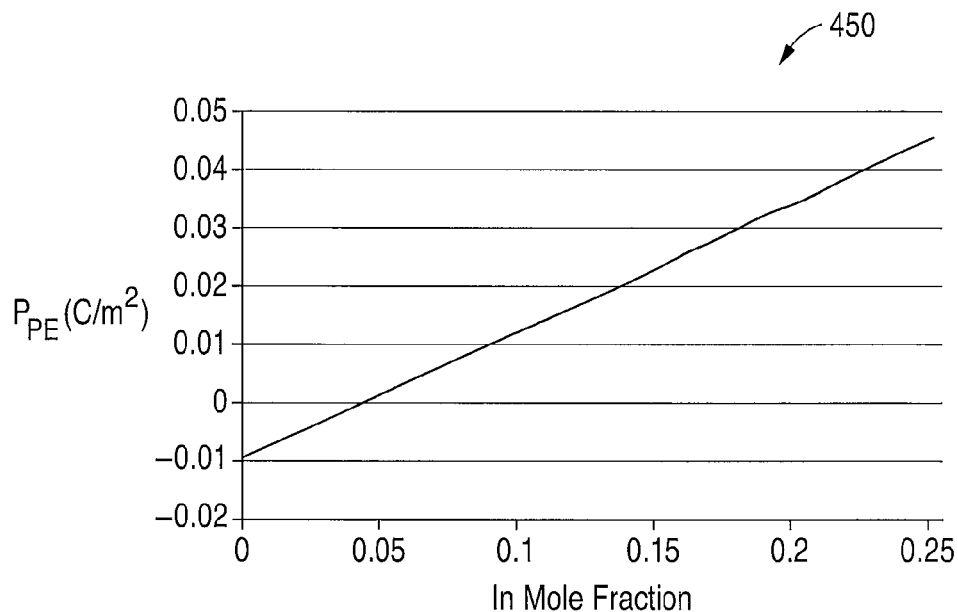

FIGS. 4A and 4B illustrate example relationships between electrical characteristics and composition of the semiconductor device 100 of FIG. 1. In particular, FIG. 4A shows a graph 400 illustrating how the spontaneous polarization $P_{SP}$ in the device 100 varies based on the indium component of the compressive layer 110 (assuming an AlInGaN compressive layer with 20% aluminum). As shown here, the spontaneous polarization $P_{SP}$ varies but only slightly, increasing only about 0.0008 C/m² for an indium component that varies from a zero mole fraction to a 0.25 mole fraction.

FIG. 4B shows a graph 450 illustrating how the piezoelectric polarization $P_{PE}$ in the device 100 varies based on the indium component of the compressive layer 110 (assuming an AlInGaN compressive layer with 20% aluminum). As shown here, the piezoelectric polarization $P_{PE}$ varies to a much greater extent, increasing more than 0.05 C/m² for an indium component that varies from a zero mole fraction to a 0.25 mole fraction.

These graphs 400 and 450 illustrate that the indium component of an AlInGaN compressive layer 110 can be adjusted to arrive at a suitable piezoelectric polarization $P_{PE}$. This piezoelectric polarization $P_{PE}$ can be selected so that it is slightly larger than the spontaneous polarization $P_{SP}$.

Figure 5:
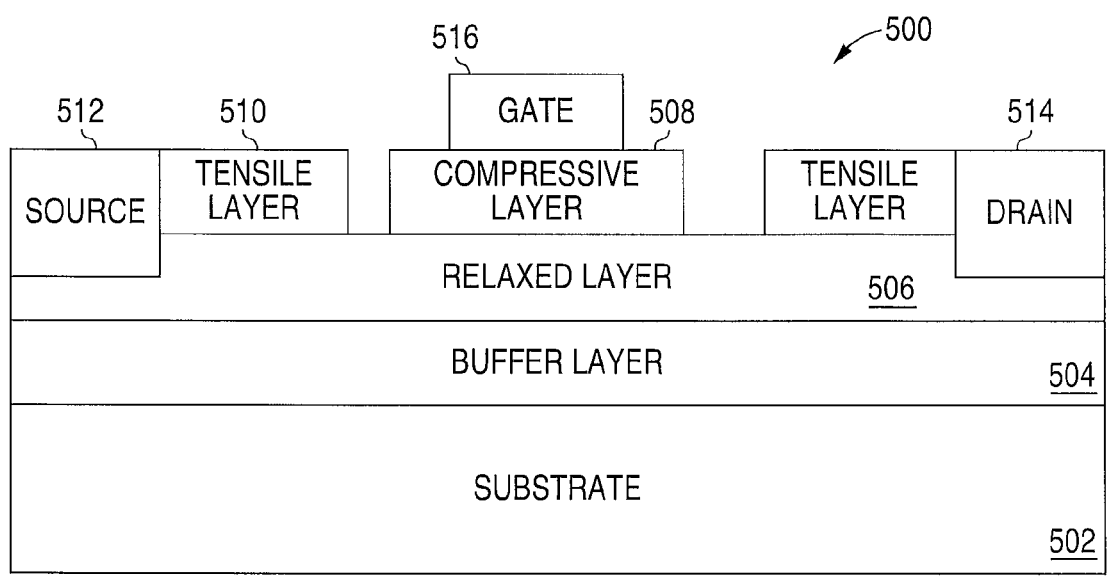
FIG. 5 illustrates a second example normally-off gallium nitride-based semiconductor device according to this disclosure.

FIG. 5 illustrates a second example normally-off gallium nitride-based semiconductor device 500 according to this disclosure. As shown in FIG. 5, the semiconductor device 500 includes a substrate 502, a buffer layer 504, and a relaxed layer 506. These components 502-506 may be the same as or similar to the corresponding components 102-106 in FIG. 1.

A compressive layer 508 is formed over the relaxed layer 506. The compressive layer 508 could be formed from any suitable material(s) and in any suitable manner. For example, the compressive layer 508 could be formed by depositing an epitaxial layer of AlInGaN and etching the AlInGaN to leave a portion of the AlInGaN over the relaxed layer 506. The compressive layer 508 could also be formed by depositing AlInGaN in a specified area defined by a mask. Again, the compressive layer 508 has enough compressive strain to compensate for the total spontaneous polarization generated in the semiconductor device 500.

A tensile layer 510 is formed over the relaxed layer 506 and beside or around the compressive layer 508. The tensile layer 510 could be formed from any suitable material(s) and in any suitable manner. For example, the tensile layer 510 could be formed from AlGaN. As a particular example, the tensile layer 510 could be formed by a selective epitaxial growth of AlGaN with a 20% aluminum content. Source and drain regions 512-514 are formed in the tensile layer 510 and possibly in the relaxed layer 506, and a gate 516 is formed over the compressive layer 508.

In the semiconductor device 100 of FIG. 1, two-dimensional electron gas can still form at the interface between the source region 112 and the layers 106-108 and at the interface between the drain region 114 and the layers 106-108. In the semiconductor device 500 of FIG. 5, two-dimensional electron gas can form at the interface between the source region 512 and the layers 506 and 510 and at the interface between the drain region 514 and the layers 506 and 510. This two-dimensional electron gas helps to provide high current and low specific-on resistance. However, the two-dimensional electron gas is located away from the gates 116 and 516 in areas where it does not cause the semiconductor devices 100 and 500 to be normally on. The two-dimensional electron gas can form in the semiconductor devices 100 and 500 because the compressive layers 110 and 508 are etched away from or not formed where the source and drain regions are located.

Although FIGS. 1 through 5 illustrate two example normally-off gallium nitride-based semiconductor devices and related details, various changes may be made to FIGS. 1 through 5. For example, while specific materials and manufacturing processes are described above, any other materials and manufacturing processes could be used to form various layers or other structures of the semiconductor devices 100 and 500. Also, while specific electrical or other characteristics are described above, these details are examples only.

Figure 6:
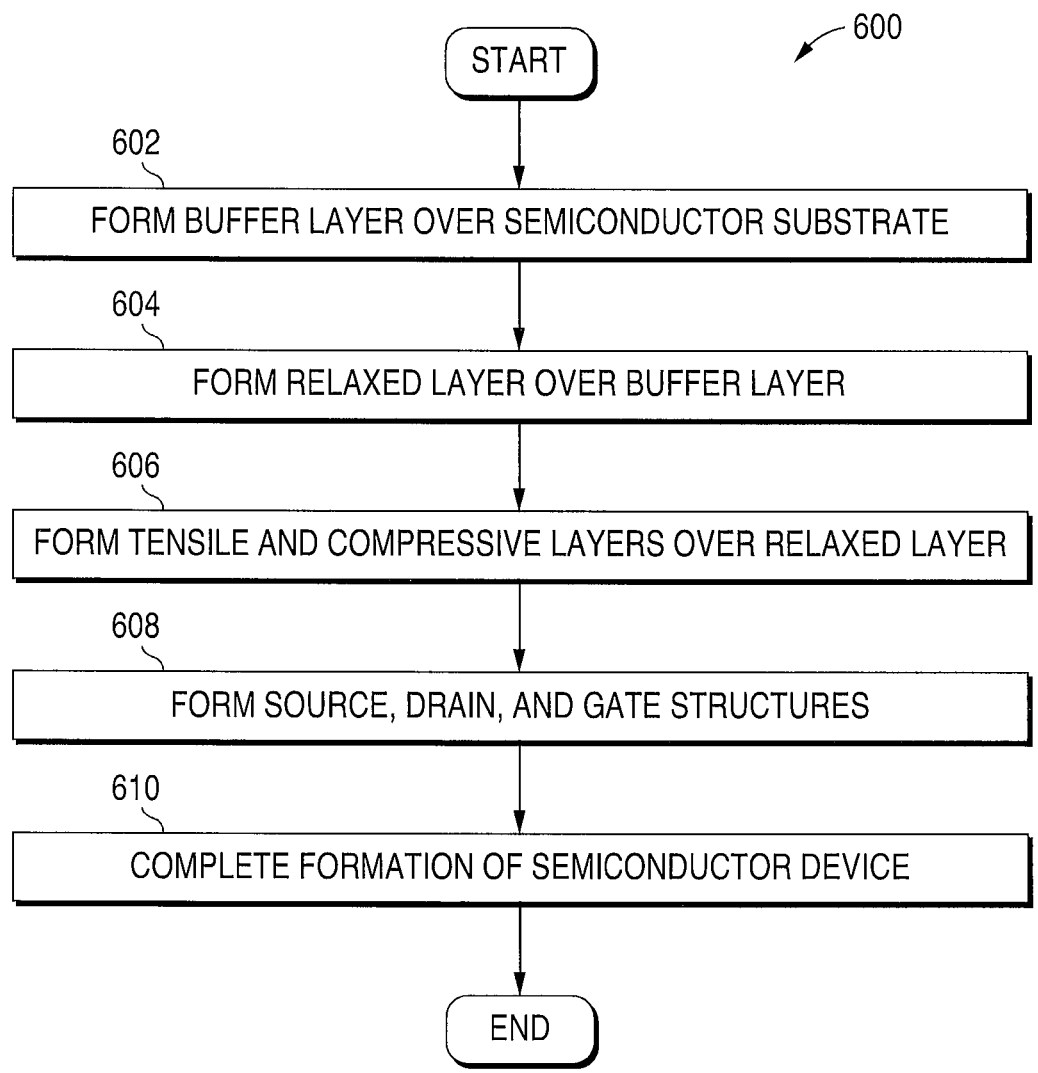
FIG. 6 illustrates an example method for forming a normally-off gallium nitride-based semiconductor device according to this disclosure.

FIG. 6 illustrates an example method 600 for forming a normally-off gallium nitride-based semiconductor device according to this disclosure. As shown in FIG. 6, a buffer layer is formed over a substrate at step 602. This could include, for example, forming the buffer layer 104, 504 over the substrate 102, 502. A relaxed layer is formed over the buffer layer at step 604. This could include, for example, forming the relaxed layer 106, 506 over the buffer layer 104, 504. Both layers could represent epitaxial layers.

Tensile and compressive layers are formed over the relaxed layer at step 606. This could include, for example, forming the tensile layer 108 over the relaxed layer 106 and forming the compressive layer 110 over the tensile layer 108. This could also include forming the compressive layer 508 over the relaxed layer 506 and forming the tensile layer 510 over the relaxed layer 506 and next to the compressive layer 508. The compressive layer has a piezoelectric polarization $P_{PE}$ that is greater than or equal to the spontaneous polarization $P_{SP}$ in the structure.

Source, drain, and gate structures are formed at step 608. This could include, for example, forming source and drain regions 112-114, 512-514 in the tensile layer 108, 510 and optionally in the relaxed layer 106, 506. Formation of the semiconductor device is completed at step 610. This could include, for example, forming electrical connections to the source, drain, and gate structures. This could also include encapsulating the semiconductor device 100, 500 in a protective package or forming other structures to complete the formation of an HEMT transistor device.

Although FIG. 6 illustrates one example of a method 600 for forming a normally-off gallium nitride-based semiconductor device, various changes may be made to FIG. 6. For example, while shown as a series of steps, various steps in FIG. 6 could overlap, occur in parallel, or occur in a different order. Also, piezoelectric polarization management through strain can be obtained in many different ways, and the method 600 illustrates one example of this.

It may be advantageous to set forth definitions of certain words and phrases that have been used within this patent document. The terms "include" and "comprise," as well as derivatives thereof, mean inclusion without limitation. The term "or" is inclusive, meaning and/or.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
    forming a relaxed layer in a semiconductor device;
    forming a tensile layer over the relaxed layer, the tensile layer having tensile stress; and
    forming a compressive layer over the relaxed layer, the compressive layer having compressive stress, wherein forming the tensile layer comprises forming the tensile layer next to the compressive layer;
    wherein the compressive layer has a piezoelectric polarization that is approximately equal to or greater than a spontaneous polarization in the relaxed, tensile, and compressive layers.

2. The method of claim 1, wherein:
    the relaxed layer comprises gallium nitride;
    the tensile layer comprises aluminum gallium nitride; and
    the compressive layer comprises aluminum indium gallium nitride.

3. The method of claim 2, wherein the aluminum indium gallium nitride has an indium mole fraction between 0.20 and 0.25.

4. The method of claim 1, wherein the piezoelectric polarization in the compressive layer is in an opposite direction than the spontaneous polarization in the compressive layer.

5. The method of claim 1, wherein forming the compressive layer comprises forming the compressive layer over the tensile layer.

6. The method of claim 1, further comprising:
    forming a buffer layer over a substrate;
    wherein forming the relaxed layer comprises forming the relaxed layer over the buffer layer.

7. The method of claim 1, wherein the semiconductor device comprises a High Electron Mobility Transistor.

8. A method comprising:
    forming a relaxed layer in a semiconductor device;
    forming a tensile layer over the relaxed layer, the tensile layer having tensile stress;
    forming a compressive layer over the relaxed layer, the compressive layer having compressive stress;
    wherein the compressive layer has a piezoelectric polarization that is approximately equal to or greater than a spontaneous polarization in the relaxed, tensile, and compressive layers;
    forming source and drain regions in at least the tensile layer; and
    forming a gate over the compressive layer.

9. The method of claim 8, wherein:
    the relaxed layer comprises gallium nitride;
    the tensile layer comprises aluminum gallium nitride; and
    the compressive layer comprises aluminum indium gallium nitride.

10. The method of claim 9, wherein the aluminum indium gallium nitride has an indium mole fraction between 0.20 and 0.25.

11. The method of claim 8, wherein forming the compressive layer comprises forming the compressive layer over the tensile layer.

12. The method of claim 8, wherein forming the tensile layer comprises forming the tensile layer next to the compressive layer.

13. A method comprising:
    forming a buffer layer over a substrate;
    forming a relaxed layer comprising gallium nitride over the buffer layer;
    forming a tensile layer comprising aluminum gallium nitride over the relaxed layer, the tensile layer having tensile stress;
    forming a compressive layer comprising aluminum indium gallium nitride over the relaxed layer, the compressive layer having compressive stress and the aluminum indium gallium nitride having an indium mole fraction between 0.20 and 0.25;
    forming source and drain regions in at least the tensile layer; and
    forming a gate over the compressive layer.

* * * * *